US011719659B2

(12) United States Patent
Offerhaus

(10) Patent No.: US 11,719,659 B2
(45) Date of Patent: Aug. 8, 2023

(54) SYSTEM AND METHOD FOR MEASURING CONDUCTIVITY

(71) Applicant: Universiteit Twente, Enschede (NL)

(72) Inventor: Herman Leonard Offerhaus, Enschede (NL)

(73) Assignee: Universiteit Twente, Enschede (NL)

( * ) Notice: Subject to any disclaimer, the term of this patent is extended or adjusted under 35 U.S.C. 154(b) by 9 days.

(21) Appl. No.: 17/048,592

(22) PCT Filed: Apr. 18, 2019

(86) PCT No.: PCT/EP2019/060126
§ 371 (c)(1),
(2) Date: Oct. 17, 2020

(87) PCT Pub. No.: WO2019/202092
PCT Pub. Date: Oct. 24, 2019

(65) Prior Publication Data
US 2021/0364460 A1   Nov. 25, 2021

(30) Foreign Application Priority Data
Apr. 18, 2018   (EP) .................... 18168099

(51) Int. Cl.
*G01N 27/07*    (2006.01)
*G01R 27/22*    (2006.01)
(52) U.S. Cl.
CPC ............. *G01N 27/07* (2013.01); *G01R 27/22* (2013.01)
(58) Field of Classification Search
CPC .... G01N 27/07; G01N 27/08; G01N 27/4162; G01N 2030/645; G01R 27/22; G01R 31/281
(Continued)

(56) References Cited

U.S. PATENT DOCUMENTS 4,118,663 A * 10/1978 Barben, II ............. G01R 27/22
                                                      324/443
5,089,781 A *  2/1992 Arichika ................ G01R 27/22
                                                      324/204
(Continued)

FOREIGN PATENT DOCUMENTS

CA    2775679 A1 *  4/2011  ............... G01F 1/64
CN    104237322 A    12/2014
(Continued)

OTHER PUBLICATIONS

International Seraching Authority of World Intellectual Property Office; Notification of transmittal of the international search report and the written opinion of the International Search Authority, or the declaration, along with the international search report and the written opinion for International Patent Application No. PCT/EP2019/060126; dated Jul. 10, 2019.
(Continued)

*Primary Examiner* — Jermele M Hollington
*Assistant Examiner* — Sean Curtis
(74) *Attorney, Agent, or Firm* — McDonnell Boehnen Hulbert & Berghoff LLP

(57) ABSTRACT

The present disclosure relates to a conductivity measuring system of a fluid including a solvent and an ionic solute, comprising: —a holder comprising an isolated holder wall defining a fluid channel for holding fluid, wherein the holder is shaped to allow an electrical current induced in the fluid to form a current loop; —an excitation device configured to excite an electric field inside a first part of the fluid channel, the excitation device comprising an electrical signal generator configured to generate an alternating current signal and a conducting slab; —a sensing device arranged at a position remote from the first part of the fluid channel and configured to sense a voltage signal (V) resulting from the changing (Continued)

magnetic field resulting from the current generated inside the fluid by the excitation device.

20 Claims, 9 Drawing Sheets

(58) Field of Classification Search
USPC .......................................... 324/439, 693, 722
See application file for complete search history.

(56) References Cited

U.S. PATENT DOCUMENTS

| | | | | |
|---|---|---|---|---|
| 5,266,899 A * | 11/1993 | Bull | ...................... | G01N 27/06 |
| | | | | 324/609 |
| 5,341,102 A * | 8/1994 | Akiyama | ............ | G01N 27/023 |
| | | | | 73/861.11 |
| 5,612,622 A * | 3/1997 | Goldman | ............ | G01N 27/025 |
| | | | | 324/672 |
| 6,819,120 B2 * | 11/2004 | Tam | ...................... | G01N 27/023 |
| | | | | 324/633 |
| 7,071,684 B2 * | 7/2006 | Red'ko | .................. | G01N 27/07 |
| | | | | 324/228 |
| 7,598,745 B2 * | 10/2009 | Hancock | ............... | G01R 27/22 |
| | | | | 324/439 |
| 8,246,910 B2 * | 8/2012 | Dhirani | ............. | G01N 27/3278 |
| | | | | 435/7.1 |
| 8,384,378 B2 * | 2/2013 | Feldkamp | ......... | A61B 5/02007 |
| | | | | 324/236 |
| 8,525,533 B2 * | 9/2013 | Sullivan | ................ | G01N 27/07 |
| | | | | 702/65 |
| 8,736,287 B2 * | 5/2014 | Dhirani | ................. | G01N 30/95 |
| | | | | 324/692 |
| 8,773,117 B2 * | 7/2014 | Feldkamp | ............... | H01F 5/003 |
| | | | | 324/236 |
| 9,310,327 B2 * | 4/2016 | Roper | .................. | G01N 27/025 |
| 10,330,619 B2 * | 6/2019 | Fougere | ................ | G01N 33/18 |
| 10,473,498 B2 * | 11/2019 | Momose | .................. | G01F 1/60 |
| 10,509,003 B2 * | 12/2019 | Vogt | ....................... | G01N 27/08 |
| 11,067,525 B2 * | 7/2021 | Momose | ................ | G01N 27/08 |
| 2005/0156604 A1 * | 7/2005 | Red'ko | .................. | G01N 27/06 |
| | | | | 324/439 |
| 2007/0247173 A1 * | 10/2007 | Tai | ...................... | G01N 27/023 |
| | | | | 324/692 |
| 2008/0211518 A1 * | 9/2008 | Hancock | ............... | G01R 27/02 |
| | | | | 324/647 |
| 2009/0267617 A1 * | 10/2009 | Seyfi | .................... | G01N 27/023 |
| | | | | 324/655 |
| 2010/0200781 A1 * | 8/2010 | Khorasani | ............ | H01L 31/101 |
| | | | | 250/576 |
| 2012/0056632 A1 * | 3/2012 | Dhirani | .................. | G01N 30/95 |
| | | | | 324/692 |
| 2012/0068723 A1 * | 3/2012 | Sullivan | ................. | G01N 27/07 |
| | | | | 324/654 |
| 2012/0326711 A1 * | 12/2012 | Roper | .................. | G01N 27/025 |
| | | | | 324/252 |
| 2016/0334352 A1 * | 11/2016 | Fougere | .................. | G01N 9/00 |
| 2018/0106743 A1 * | 4/2018 | Vogt | ....................... | G01N 27/08 |
| 2018/0246050 A1 * | 8/2018 | Momose | .............. | G01N 27/045 |
| 2020/0393395 A1 * | 12/2020 | James | ................. | A61M 1/3609 |
| 2021/0364460 A1 * | 11/2021 | Offerhaus | .............. | G01N 27/07 |
| 2023/0047601 A1 * | 2/2023 | Wang | ....................... | G01K 7/06 |

FOREIGN PATENT DOCUMENTS

| | | | | | |
|---|---|---|---|---|---|
| CN | 105353223 | A | * | 2/2016 | |
| CN | 105593677 | A | * | 5/2016 | ............. G01N 21/59 |
| CN | 106154048 | A | * | 11/2016 | |
| CN | 106199205 | A | * | 12/2016 | ............. G01R 27/22 |
| CN | 108445298 | A | * | 8/2018 | ............. G01R 27/22 |
| CN | 111044581 | A | * | 4/2020 | ............. G01N 27/07 |
| CN | 111175375 | A | * | 5/2020 | ........... B65D 81/365 |
| CN | 111751625 | A | * | 10/2020 | |
| DE | 19537059 | A1 | * | 4/1997 | .......... G01N 27/023 |
| DE | 102005029070 | B3 | * | 2/2007 | ............. G01N 27/08 |
| DE | 202011109289 | U1 | * | 4/2012 | ............. G01N 27/07 |
| EP | 0721103 | A1 | | 7/1996 | |
| EP | 0721103 | A1 | * | 10/1996 | |
| JP | 60190873 | A | * | 9/1985 | |
| JP | 3206990 | B2 | | 9/2001 | |
| KR | 20200011370 | A | * | 2/2020 | |
| KR | 20200011371 | A | * | 2/2020 | |
| KR | 20200011372 | A | * | 2/2020 | |
| WO | WO-2005069022 | A1 | * | 7/2005 | ............. G01R 27/02 |
| WO | WO-2010099618 | A1 | * | 9/2010 | ......... G01N 27/4473 |
| WO | WO-2011096946 | A1 | * | 8/2011 | ............ G01N 27/023 |
| WO | WO-2012037106 | A1 | * | 3/2012 | ............. G01N 27/07 |
| WO | WO-2016158372 | A1 | * | 10/2016 | ............. G01N 27/06 |
| WO | WO-2019202092 | A1 | * | 10/2019 | ............. G01N 27/07 |
| WO | WO-2020251659 | A1 | * | 12/2020 | ............. A61M 1/16 |
| WO | WO-2021142862 | A1 | * | 7/2021 | ........... B65D 81/365 |

OTHER PUBLICATIONS

Wang Y. X. et al; Online measurement of conductivity/permittivity of fluid by a new contactless impedance sensor; Review of Scientific Instruments, AIP; Melville, NY, vol. 88, No. 5; May 16, 2017.

* cited by examiner

SYSTEM AND METHOD FOR MEASURING CONDUCTIVITY

BACKGROUND

This present disclosure relates to a conductivity measuring system with the purpose of contactless detection of frequency dependent conductivity of a fluid including a solvent and an ionic solute. The disclosure also relates to the use of a conductivity measuring system and to a method of contactless detecting frequency dependent conductivity of a fluid including a solvent and an ionic solute.

Fluid composition analysis by measuring conductivity of a body of fluid is a well-known approach, and finds application in a growing number of technical fields. Several types of conductivity sensors are known.

One type of sensors use contact electrodes that are in direct contact with the fluid. The number of contact electrodes may vary. In four-terminal sensing (also known as Kelvin sensing) four electrodes are used, one pair of current-carrying electrodes and one pair of voltage-sensing electrodes. In two-terminal sensing the electrodes are used both to supply current to the fluid and to sense the resulting voltage. This type of conductivity sensor can be very easily setup, but the measurements may be confused by boundary charges and, in case of the two-terminal sensing example, varying contact resistance. Furthermore, conversion at the electrodes may cause chemical changes and/or corrosion of the electrodes.

Another type of sensors (i.e. contactless sensors) use electrodes that are not in direct contact with the fluid. These sensors induce an electric field through a varying magnetic flux, and the resulting voltage can be picked-up by a detector. This type of sensor is more complex. Furthermore, the known sensor make use of coils which seriously limits the use of high frequencies for the excitation.

In general a conductivity measurement is performed at a single frequency and can only yield the total ionic strength of the fluid. The composition in type of salts, for instance, cannot be measured.

There is a need to provide an improved method and system for conductivity sensing wherein the above and/or other disadvantages of the known sensors are removed or at least reduced. There is also a need to provide a method and system for conductivity sensing wherein the composition of the fluid in terms of at least one of the type of constituents (i.e. the type of solvent and/or ionic solute) and the concentration of at least one of the constituents can be determined, preferably in a contactless manner.

Overview

According to a first aspect a conductivity measuring system with the purpose of contactless detection of frequency dependent conductivity of a fluid including a solvent and an ionic solute, is provided, wherein the conductivity measuring system comprises:—a holder comprising a holder wall comprised of electrically insulating material, defining a fluid channel for holding fluid, wherein the holder is shaped to allow an electrical current induced in the fluid to form a current loop inside the fluid channel;

an excitation device arranged outside of the holder and configured to excite an electric field inside a first part of the fluid channel, the excitation device comprising:
an electrical signal generator configured to generate an alternating current signal with one ore more predefined frequencies;
a conducting slab, placed on or in the direct vicinity of the holder wall of the first part of the fluid channel, the conducting slab comprising connection elements arranged at different longitudinal positions along the fluid channel and connected to the electrical signal generator, wherein the electrical signal generator and the conducting slab are configured to induce between the connections elements a current through the conducting slab inducing an electrical current in the fluid inside the first part of the fluid channel, wherein the electrical current induced in the fluid forms said current loop inside the fluid channel;
a sensing device arranged outside of the holder at a position remote from the first part of the fluid channel and configured to sense a voltage signal resulting from the electrical current induced inside the fluid by the excitation device.

In an embodiment of the present disclosure the conducting slab has an elongated shape extending in the longitudinal direction of the first part of the fluid channel. The longitudinal direction here is the direction parallel to the length of the associated part of the fluid channel (i.e. the first part of the fluid channel). Note here that the term "conducting slab" may include any flat or curved plate or layer, any flat wire (for instance in microchip implementations), strip, tubular (such as a cylindrical) element, etc., as long as they have a sufficient thickness to excite and/or sense an EM field. Therefore, in another embodiment of the present disclosure, the elongated conducting slab is formed by a conductive strip arranged along the isolated holder wall defining the first part of the fluid channel. In still another embodiment of the present disclosure wherein the isolated holder wall of the first part of the fluid channel has a generally tubular shape, the conducting slab may have a generally tubular shape partly or fully surrounding the isolated holder wall. For instance, the (first) conducting slab may form a cylindrical outer tube arranged around a cylindrical holder wall.

In an embodiment of the present disclosure wherein the conducting slab has a first longitudinal end and a second longitudinal end, the first connection element may be arranged at the first longitudinal end and a second connection element may be arranged at the second longitudinal end of the conducting slab. This arrangement of connection elements may easily induce a current in the fluid.

In an embodiment of the present disclosure the sensing device comprises a sensing element wherein the sensing device comprises:
a second conducting slab, placed on or in the direct vicinity of the holder wall of a second part of the fluid channel, remote from the first part of the fluid channel, and comprising connection elements arranged at different longitudinal positions along the fluid channel and connected to a voltage sensor;
a voltage sensor connected to the connection elements of the second conducting slab and configured to sense the voltage generated in the second conducting slab as a result of the current through the second conducting slab between the connection elements resulting from the electrical current induced inside the fluid in the second part of the fluid channel.

Alternatively or additionally a sensing device is provided that comprises:
a sense coil placed on or in the direct vicinity of the holder wall of a second part of the fluid channel, remote from the first part of the fluid channel, and arranged around the holder wall; and a voltage sensor connected to the sense coil and configured to sense the voltage generated in the sense coil as a result of the electrical current in the fluid in the second part of the fluid channel.

placed on or in the vicinity of the isolated holder wall of a second part of the fluid channel, remote from the first part of the fluid channel.

Using conductions slabs both the for excitation and detection (sensing) has proven to be an efficient setup that creates reasonable signal levels that can be measured accurately.

In other embodiments the sensing device comprises a sense coil arranged around the isolated holder wall of the second part of the channel and a voltage sensor connected to the sense coil and configured to sense the voltage generated in the sense coil as a result of the current in the fluid in the second part of the fluid channel.

In order to achieve better measurement results it is preferred to shield the measurement of the sensing device from the influence (interference) of the excitation device. In embodiments of the present disclosure the first part of the channel extends at an angle ($\alpha$) with respect to the second part of the channel (for instance, obliquely or at a right angle). For instance, the longitudinal direction of the first part of the fluid channel extends at an angle ($\alpha$) relative to the longitudinal direction of the second part of the fluid channel, wherein the angle is in the range of about 30-120 degrees, for instance between 80 and 100 degrees.

In an embodiment of the present disclosure the holder comprises an existing fluid tube and a retrofitted bypass fluid channel. The excitation device and/or the sensing device may be attached to the existing fluid tube and/or the existing fluid tube. In this manner an existing conductivity measuring system may be provided with the present measurement system, with minimal intervention (for instance, only two openings in the existing tube need to be made to allow the bypass tube to be filled with fluid).

In an embodiment of the present disclosure the electrical signal generator is configured to generate an alternating current signal of varying frequency. Furthermore, the sensing device may be configured to sense the resulting varying voltage signal. This combination of features enables the system to determine the voltage signal as function of the frequency. The voltage signal as function of the frequency can be used to retrieve information about the actual composition of the fluid, as will be explained later.

In further embodiments the electrical signal generator is configured to generate a current signal in the range of 100 kHz up to 100 MHz. When a voltage signal in a corresponding frequency range is measured, the voltage signal may provide accurate information about the composition, for instance about the type of salts present in the fluid.

In a further embodiment the conductivity measuring system comprises an analyser configured to determine from the measured voltage signal as function of the frequency a composition signal representative of the composition of the fluid. The composition signal may contain an indication of the type (for instance the type of salts present in the fluid) and/or concentration of at least one of the solvent and ionic solute. For instance both the solvent and the solute, the solvent where a known solute has been added as to identify the solvent, or the solute where a known solvent has been added as to identify the solute.

In an embodiment of the present disclosure at least the conduction slab of the exciting device and/or the sensing device, preferably also at least one of the holder, electrical signal generator and sensing device, are fabricated in a microchip environment.

In an embodiment of the present disclosure the isolated holder walls of the holder form a loop-shaped channel. This enables to a current loop inside the channel. In another embodiment the isolated holder walls of the holder form a closed channel. In still another embodiment the isolated holder walls of the holder form an open channel comprising a supply opening for supplying fluid and a discharge opening for discharge of fluid, wherein the fluid channel extends between the supply opening and discharge opening. In still another embodiment the holder comprises a container and a tubular holder wall arranged in the interior of the container, the tubular holder wall forming the fluid channel. In use the fluid channel formed by the holder wall inside the container is immersed in the fluid. In other words, the return path of the current is through the bulk of the fluid, i.e. the part of the fluid outside the fluid channel. In an embodiment of the present disclosure also the excitation device, optionally also the sensing device, is/are arranged in the interior of the container. In use, the excitation device and the sensing device may be completely immersed in the fluid.

In an embodiment of the present disclosure a conducting slab of the exciting device, preferably also the conducting slab of the sensing device, comprises a first conducting slab part arranged to face the fluid channel, a second conducting slab part arranged away from the first conducting slab part and a connection element electrically connecting the first and second conducting slab parts, the first and second connection elements being positioned at the free ends of the first and second conducting slab parts, respectively. The first conducting slab part may extend generally parallel to the second conducting slab part. The conducting slab parts may be strips, (partial) tubes, flat wires, and the like. The radial distance between the first and second conducting slab parts should be sufficiently large to provide a return diameter that is significantly larger than the forward diameter so that the net A-field is considerable. Furthermore, this embodiment makes it possible to bring the excitation endpoints and/or measurement endpoints close together. This has practical implications, for instance in terms of ease of fabrication. Furthermore, the conducting slab parts arranged in this manner may accelerate the decay of the field for larger distances and thereby reduce the risk of unwanted interference between the excitation device and sensing device.

According to another aspect the present disclosure also relates to the use of the conductivity measuring system as defined herein.

According to another aspect a method of contactless detecting frequency dependent conductivity of a fluid including a solvent and an ionic solute, is provided, wherein the method comprises:

arranging the fluid in a holder comprising an isolated holder wall defining a fluid channel for holding the fluid, wherein the holder is shaped to allow an electrical current induced in the fluid inside the fluid channel to form a current loop;

exciting an electric field inside a first part of the fluid channel, wherein exciting the electric field comprises generating an alternating current signal with one or more predefined frequencies and supplying the alternating current signal to connection elements of a conducting slab, the conducting slab having been placed on or in the direct vicinity of the isolated holder wall of the first part of the fluid channel, so as to induce a current in the fluid inside the first part of the fluid channel;

sensing a voltage signal (V) as a result of a changing magnetic field resulting from the current that has been generated inside the fluid.

In an embodiment of the present disclosure the method comprises:
  generating an alternating current signal of varying frequency; and
  sensing the varying voltage signal resulting from the generation of the alternating current so as to determine the voltage signal as function of the frequency.

In an embodiment of the present disclosure the method comprises generating the current signal with frequencies in the range of 100 kHz up to 100 MHz.

In an embodiment of the present disclosure the method comprises determining from the measured voltage signal as function of the frequency a composition signal representative of the composition of the fluid.

BRIEF DESCRIPTION OF THE DRAWINGS

Further advantages, features and details of the present invention will de elucidated on the basis of the following descriptions of serval embodiments thereof. Reference is made in the description to the figures, in which:

FIGS. 1A-2D are schematic representations for elucidating the interaction between the constituents of the fluid (the fluid containing at least a solvent SV and an ionic solute S) and the components of the conductivity measuring system.

FIG. 1A shows the ionic solute S at the beginning of a period of its harmonic motion where the harmonic motion takes place at a low frequency.

FIG. 2D presents the interaction between the solvent and the ionic solute where the ionic solute is seen at the end of a period of its harmonic motion where the harmonic motion takes place at a high frequency.

DETAILED DESCRIPTION

Figure 1A:
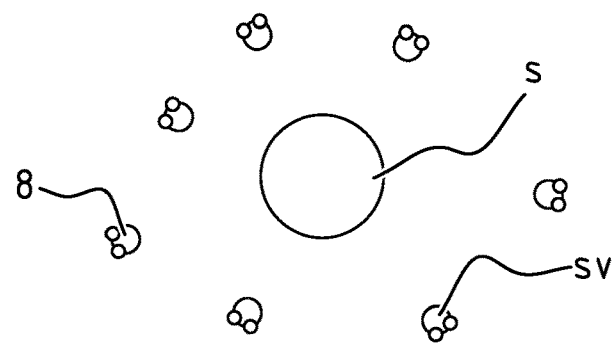

Before the present invention is described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Furthermore, unless defined otherwise, all technical and scientific terms used herein have the same meaning as commonly understood by one of ordinary skill in the art to which this invention belongs. Still, certain elements are defined below for the sake of clarity and ease of reference.

Although any methods and materials similar or equivalent to those described herein can also be used in the practice or testing of the present invention, representative illustrative methods and materials are now described.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Certain ranges are presented herein with numerical values being preceded by the term "about." The term "about" is used herein to provide literal support for the exact number that it precedes, as well as a number that is near to or approximately the number that the term precedes. In determining whether a number is near to or approximately a specifically recited number, the near or approximating unrecited number may be a number which, in the context in which it is presented, provides the substantial equivalent of the specifically recited number.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete elements, components and features which may be readily separated from or combined with the features of any of the other several embodiments without departing from the scope of the present invention. Any recited method can be carried out in the order of events recited or in any other order which is logically possible.

FIGS. 1A-1D present a step by step explanation of the interaction between an ionic solute S, here including a positively charged ion and a solvent SV, here water, as result of an alternating E-field being applied by the present conductivity measuring system which which has a relatively low frequency. In this case we define a low frequency as all frequencies which induce this behavior.

The ionic solute S experiences a force from the excited E-field. Because of the low frequency of this alternating E-field, the longitudinal wavelength of the motion of the ionic solute S is relatively large when compared to the distance between the ionic solute S and the solvent SV shell surrounding it, causing it to significantly deform the shell. This deformation requires an amount of energy which effectively lowers the induced electrical current and equivalently decreases the conductivity of the fluid at hand.

Note that regardless of the charge-related interaction between the charged ionic solute S and the charge-neutral bipolar water molecule, only the movement of the ionic solute S results in an effective motion of electric charge which is globally summarized as an electrical current.

FIG. 1A presents the interaction between the solvent SV and the ionic solute S where the ionic solute S is seen at the beginning of a period of its harmonic motion where the harmonic motion takes place at a low frequency. Notice solvent shell comprising the solvent SV and encapsulating the ionic solute S.

Figure 1B:
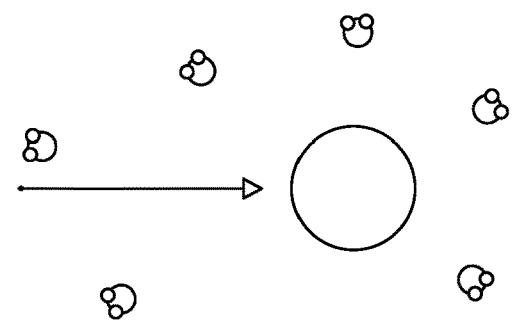
FIG. 1B shows the interaction between the solvent and the ionic solute where the ionic solute is seen at a quarter of a period of its harmonic motion where the harmonic motion takes place at a low frequency.

FIG. 1B presents the interaction where the ionic solute S is seen at a quarter of a period of its harmonic motion where the harmonic motion takes place at a low frequency. The ionic solute S has moved one amplitude distance, in the framework of FIG. 1B to the right. The E-field applied therefore must be perpendicular to this direction. Notice that the ionic solute S has deformed its solvent shell which implies that a certain amount of work has been done. This work has originated from the E-field, setting the ionic solute S into motion but not the charge-neutral solvent SV. The work that gone into that deformation no longer contributes to the motion of the ionic solute S and therefore no longer contributes to the induced electrical current.

Figure 1C:
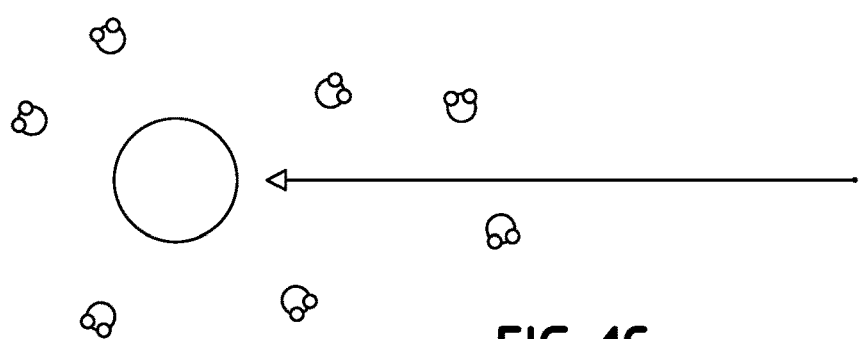
FIG. 1C presents the interaction between the solvent and the ionic solute where the ionic solute is seen at three quarters of a period of its harmonic motion where the harmonic motion takes place at a low frequency.

FIG. 1C presents the interaction where the ionic solute S is seen at three quarters of a period of its harmonic motion where the harmonic motion takes place at a low frequency. The ionic solute S has moved two amplitude distances, in the framework of FIG. 1C to the left. The E-field applied therefore must be perpendicular to this direction and opposite to the direction as it has been mentioned in FIG. 1B.

Figure 1D:
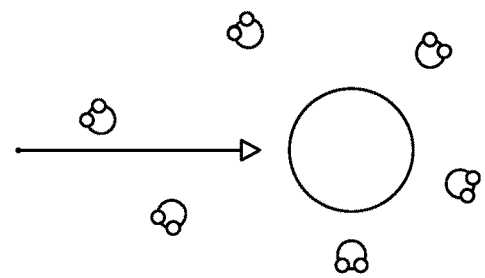
FIG. 1D presents the interaction between the solvent and the ionic solute where the ionic solute is seen at the end of a period of its harmonic motion where the harmonic motion takes place at a low frequency.

FIG. 1D presents the interaction where the ionic solute S is seen at the end of a period of its harmonic motion where the harmonic motion takes place at a low frequency. The ionic solute S has moved one amplitude distance, in the framework of FIG. 1D to the right. The location of the ionic solute S is now the same as at the start of a period of its harmonic motion as has been seen in FIG. 1A. The E-field applied therefore must be perpendicular to this direction and in the same direction as shown in FIG. 1B.

FIGS. 2A-2D present a step by step explanation of the interaction between the ionic solute and solvent as result of an alternating E-field being applied which has a relatively high frequency. In this case we define a high frequency as all frequencies which induce this behavior.

The ionic solute experiences a force from the excited E-field. Because of the high frequency of this alternating E-field, the longitudinal wavelength of the motion of the ionic solute is relatively small when compared to the distance between the ionic solute and the solvent shell surrounding it, causing it to insignificantly deform the shell. No deformation requires hardly any amount of energy and therefore does not substantially lower the induced electrical current and equivalently increases the conductivity of the fluid at hand. Note that regardless of the charge-related interaction between the charged ionic solute and the charge-neutral bipolar water molecule, only the movement of the ionic solute results in an effective motion of electric charge which is globally summarized as an electrical current.

Figure 2A:
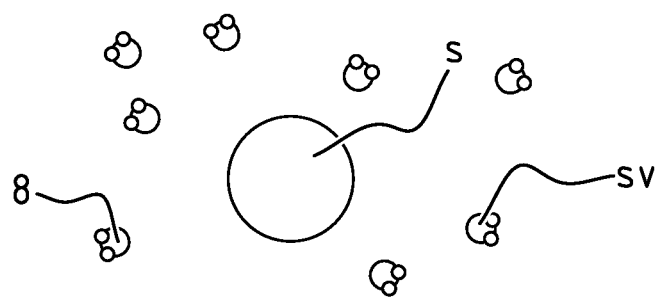
FIG. 2A presents the interaction between the solvent and the ionic solute where the ionic solute is seen at the beginning of a period of its harmonic motion where the harmonic motion takes place at a high frequency.
Figure 2B:
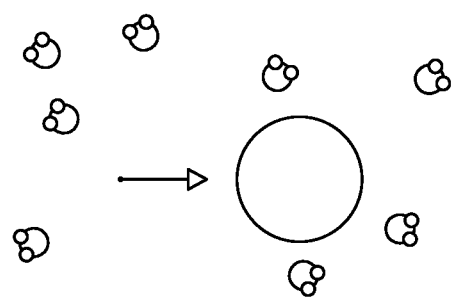
FIG. 2B presents the interaction between the solvent and the ionic solute where the ionic solute is seen at a quarter of a period of its harmonic motion where the harmonic motion takes place at a high frequency.

FIG. 2A presents the interaction where the ionic solute is seen at the beginning of a period of its harmonic motion where the harmonic motion takes place at a high frequency. Notice solvent shell comprising the solvent and encapsulating the ionic solute. FIG. 2B presents the interaction where the ionic solute is seen at a quarter of a period of its harmonic motion where the harmonic motion takes place at a high frequency. The E-field applied therefore must be perpendicular to this direction. Notice that the ionic solute has hardly deformed its solvent shell which implies that very little of work has been done. This work has originated from the E-field, setting the ionic solute into motion but not the charge-neutral solvent. The work that gone into that deformation no longer contributes to the motion of the ionic solute and therefore no longer contributes to the induced electrical current.

Figure 2C:
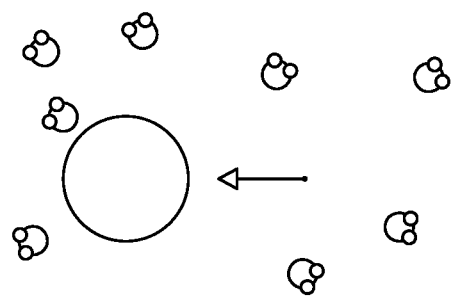
FIG. 2C presents the interaction between the solvent and the ionic solute where the ionic solute is seen at three quarters of a period of its harmonic motion where the harmonic motion takes place at a high frequency.
Figure 2D:
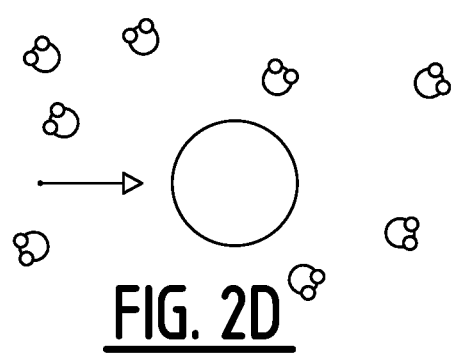

FIG. 2C presents the interaction where the ionic solute is seen at three quarters of a period of its harmonic motion where the harmonic motion takes place at a high frequency. The ionic solute has moved two amplitude distances, in the framework of FIG. 2C to the left. The E-field applied therefore must be opposite to the direction as it has been mentioned in FIG. 2B. FIG. 2D presents the interaction between a solvent and an ionic solute where the ionic solute is seen at the end of a period of its harmonic motion where the harmonic motion takes place at a high frequency. The location of the ionic solute is now the same as at the start of a period of its harmonic motion as has been seen in FIG. 2A. The E-field applied therefore must be opposite to direction as shown in FIG. 4B.

The longitudinal wavelength of the motion of the ionic solute is characterized by a combination of the strength and frequency of the E-field, the size and weight of solvent and the size, weight and concentration of the solute. Therefore the resulting induced electrical current is a function of at least those characteristics of the fluid. Consequently, by sensing the induced electrical current an indication of the composition of the fluid may be obtained.

Figure 3A:
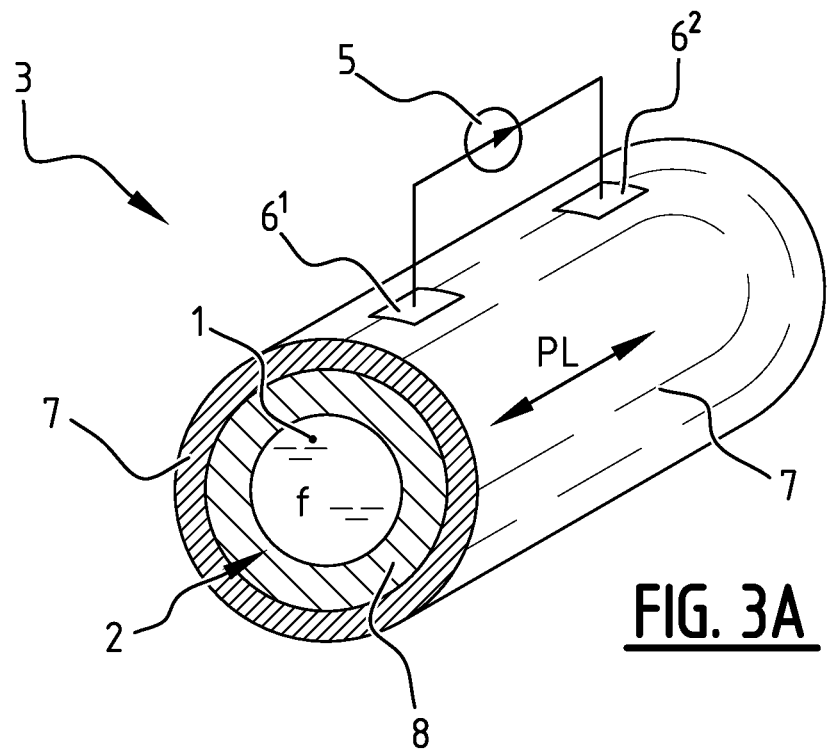
FIG. 3A is a side view of a holder and an excitation device of a conductivity measuring system according to an embodiment of the present disclosure.

FIG. 3A presents a side view of an embodiment of the excitation side of the conductivity measuring system. More specifically, the figure shows an embodiment of a holder combined with an excitation device. The figure shows a part of a central fluid channel 1 formed by a tubular holder wall 8 of a holder 2. In the central fluid channel a fluid f (schematically indicated by dashed lines). may be present. The holder wall is made of electrically insulating material. The embodiment also comprises an excitation device 3 for exciting an electric field inside the shown part of the fluid channel 1. The excitation device 3 comprises an electrical signal generator 5 connected via two connection elements $6^1, 6^2$ with a tubular conducting slab 7 surrounding the tubular holder wall 8. The tubular conducting slab 7 forms an insulating mantle around the holder wall 8. The connection elements $6^1, 6^2$ are located at differential longitudinal positions (i.e. at different positions seen in the longitudinal direction $P_L$, FIG. 3A). The electrical signal generator 5 and the connection elements $6^1, 6^2$ are configured to generate an alternating current (signal) in the conducting slab 7 running in longitudinal direction. The electrical signal generator 5 may generate a current signal alternating in one frequency, but in other embodiments the electrical signal generator 5 may generate a current signal alternating with varying frequencies. The electrical current generator may for instance generate an alternating current with frequencies sweeping from a minimum frequency (for instance about 100 kHz) to a maximum frequency (for instance about 100 MHz or higher) or from the maximum frequency towards the minimum frequency.

Figure 3B:
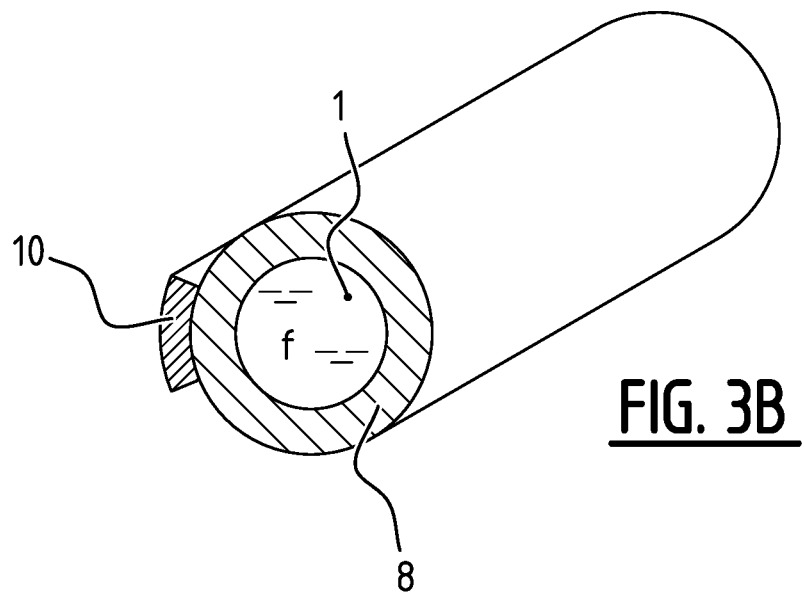
FIG. 3B is a side view of a holder and an excitation device of a conductivity measuring system according to another embodiment of the present disclosure.

The conducting slab 7 is in the shown embodiment a tubular slab placed onto the isolating holder wall 8 and in fact is arranged to completely surround the holder wall 8. In other embodiments the conducting slab is not actually placed on the outer surface of the holder wall but arranged in the close or direct vicinity of the holder wall. Furthermore, while the figure shows an embodiment wherein the holder wall 8 is completely surrounded by a conducting slab (i.e. the conducting slab is a tube), in other embodiments the conducting slab is only a part of a tube, for instance a tube conducting slab part as shown in FIG. 3B. Furthermore, while FIG. 3A only shows the excitation side of the conductivity sensing system, the sensing side of the conductivity measuring system may also comprise a holder, in combination with a sensing device. The sensing device is arranged at a different part of the fluid channel 1 (i.e. at a position sufficiently remote from the first part of the fluid channel) and may have a similar configuration as to the excitation device. For instance, the sensing device may comprise a conducting slab of similar shape and constitution as the conducting slab 7 of the excitation device and may comprise, instead of the electrical signal generator 5, a voltage sensor connected to the conducting slab via similar connection elements. The sensing device is configured to sense a voltage signal (V) resulting from the changing current generated inside the fluid by the excitation device 3.

The conducting slab 7 extends a relevant distance into the direction of the fluid channel 1. The current flowing through the conducting slab 7 excites an E-field on the inside of the fluid channel which the ionic solute naturally counteracts by moving in the opposite direction of the E-field, resulting in an induced current flowing in opposite direction.

FIG. 3B similar cut-away view of an alternative embodiment of the holder and excitation device of the conductivity measuring system. Again, a circular cross-section of the fluid channel 1 forms the center of the figure and it is encircled by the adjacent holder wall 8 which takes the shape of a tubular, insulating mantle. The conducting slab in this embodiment is a strip 10 formed by a beam, plate, flat wire, or layer directly placed yet only partly surrounding the holder wall 8.

The strip-shaped conducting slab 10 extends a relevant distance along a part of the fluid channel. The current flowing through the conducting slab 10 also excites an E-field on the inside of the fluid channel which the ionic solute naturally counteracts by moving in the opposite direction of the E-field, resulting in an induced current flowing in opposite direction.

Figure 3C:
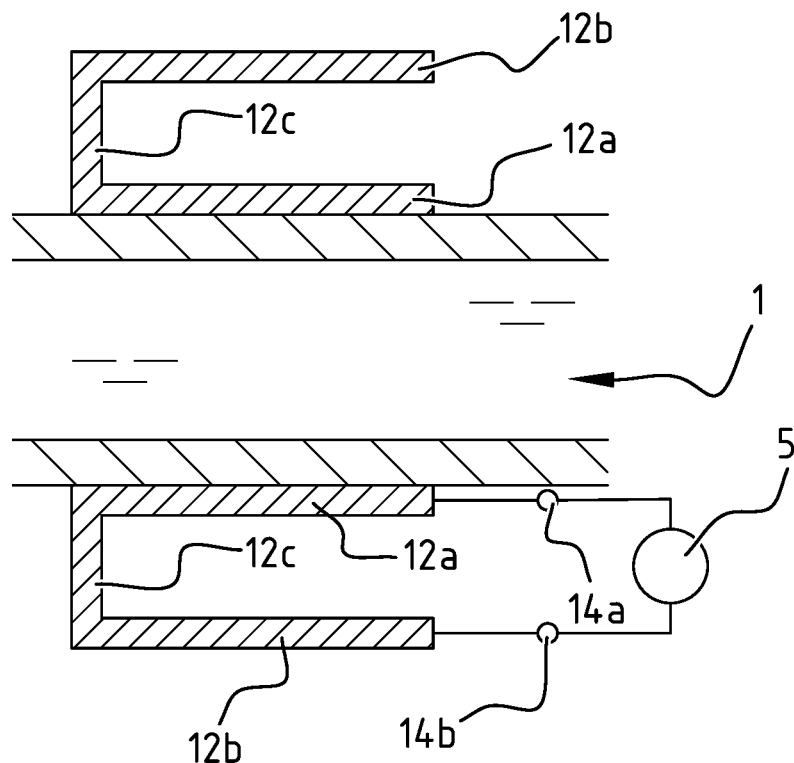
FIGS. 3C and 3D present cross-sections of respective further embodiments of a holder and an excitation device.

FIG. 3C presents a cross-section of a further embodiment of the excitation side of the conductivity measuring system, parallel to the direction to the fluid channel 1, which in the framework of FIG. 1C is in the horizontal direction. The fluid channel 1 is shown to allow fluids to move, in the framework of FIG. 1C from the left side to the right or the other way around. The conducting slab has a substantially tubular form and comprises concentric conducting slab parts. The first conducting slab part 12a is placed directly on the outer surface of the holder wall and is arranged to face the fluid channel 1, while the concentric second conducting slab part 12b is arranged away from the first conducting slab part 12a and is electrically connected through a connection part 12c to the first conducting slab part 12a. The first and second conducting slab parts extend generally parallel to each other and parallel to the fluid channel. While in the shown embodiment the conducting slab comprises two concentric tubular conducting slab parts, in other embodiments the conducting slab parts may take a different shape, for instance partial tubular, strip-shaped, etc. and the like. Furthermore, the number concentric tubular conducting slab parts may also be three or more and/or the conductive slab parts may be embodied as tubular Litze-elements, as will be explained later.

The radial distance (d) between the first and second conducting slab parts 12a, 12b and hence the height of the connecting part 12c should be sufficiently large. The first conducting slab part 12a then may strongly interact with any fluid (f) in the fluid channel 1 since it is in the direct vicinity of the fluid, while the second conducting slab part 12b more weakly interacts with the fluid since it is placed sufficiently far away from the fluid. In the gap between the first and second conducting slab parts a passive material may be arranged, but the gap may also be kept empty (i.e. that only air is present between the conductive slab parts).

All these embodiments have the advantage that they bring the excitation endpoints (contact points) 14a, 14b and/or measurement endpoints (in case the sensing device has a similar configuration) at the same side and even close together, as is shown in FIG. 3C, simplifying connecting the conducting slab to surrounding components of the conductivity measuring system and reducing the magnitude of the far field induced by the conducting slab.

The forward current flowing through the conducting slab may flow in the strongly interacting conducting slab part (conducting slab part 12a) from the right side to the left and then from the strongly interacting conducting slab part (conducting slab part 12a) to the weakly interacting element (conducting slab part 12b). As a result the returning current flows in the weakly interacting conducting slab part from the left side to right. A sufficient distance between the strongly interacting element and the weakly interacting element ensures that an E-field is induced in the fluid channel 1. To counteract the E-field, the ionic solute naturally motions in the opposite direction of the current that induced the E-field. In this scenario this was the forward current flowing through the strongly interacting conducting slab part 12a from left to right. The induced electrical current therefore flows from right to left.

Figure 3D:
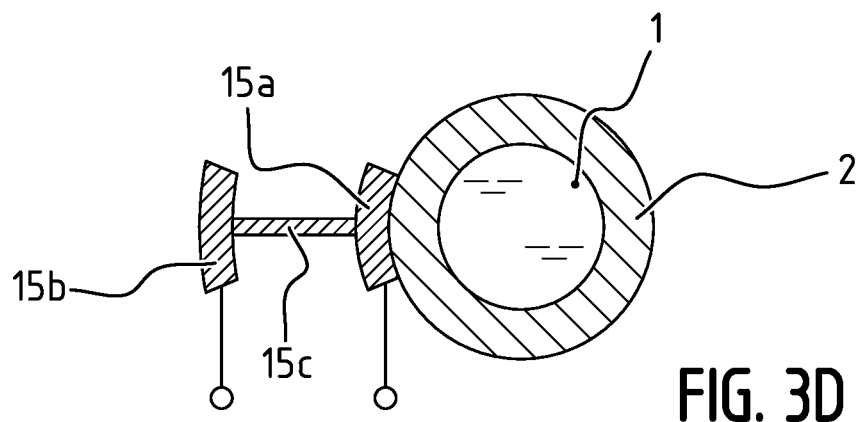

FIG. 3D present a cross-section of a further embodiment of the conductivity measuring system, perpendicular to the direction of the fluid channel 1, which in the framework of FIG. 3D points directly in the direction of the omitted dimension. The embodiment corresponds partially to the embodiment of FIG. 3C. Whereas in the embodiment of FIG. 3C the inner slab part 12a is a tube completely or for a large part surrounding the channel in the holder, in the embodiment of FIG. 3D the conductive slab parts 15a, 15b are shaped as (slightly curved) conductive strips mutually connected via a connection part 15c. The first (inner) conducting slab part or strip 15a strongly interacts with the body of the fluid 1 since it is in the direct vicinity of the body of the fluid (f). The second (outer) conducting slab part or strip 15b more weakly interacts with the body of the fluid since it is placed sufficiently far away from fluid channel 1. The shown arrangement allows a single conducting slab to have both of its minimally required two connection elements with the electrical source (i.e. the electrical signal generator) on the same side, simplifying connecting the element to surrounding elements of the application and reducing the magnitude of the far field induced by the conducting slab. The connection part 15c (together with the outer slab part 15b) in this embodiment forms one of the connection elements with which the inner slab 15a is connected to the electrical signal generator 5, while the other connection element is formed by the contact point 14a of the inner slab part 15a. In this manner the connections elements for connecting the inner slab part 15a with the electric signal generator 25 ares arranged at different longitudinal positions along the wall of the holder. The forward current flowing through the conducting slab may flow in the strongly interacting conducting slab part 15a and then from the strongly interacting conducting slab part 15a to the weakly interacting element 15b. As a result the returning current flows in the weakly interacting conducting slab part 15b. A sufficient distance between the strongly interacting element 15a and the weakly interacting element 15b ensures that an E-field is induced in the fluid channel 1. To counteract the E-field, the ionic solute naturally motions in the opposite direction of the current that induced the E-field. In this scenario this was the forward current flowing through the strongly interacting conducting slab part 15a in to the two dimensional representation.

The conducting slab 15 is shown to comprise conducting slab parts 15a and 15b directly connected to each other. In a microchip environment such conducting slab parts 15a, 15b can be achieved by producing sufficiently large surfaces in different layers of the microchip and such a direct connection between the conducting slab parts 15a,15b could for example be achieved by using one or more via's.

Figure 4A:
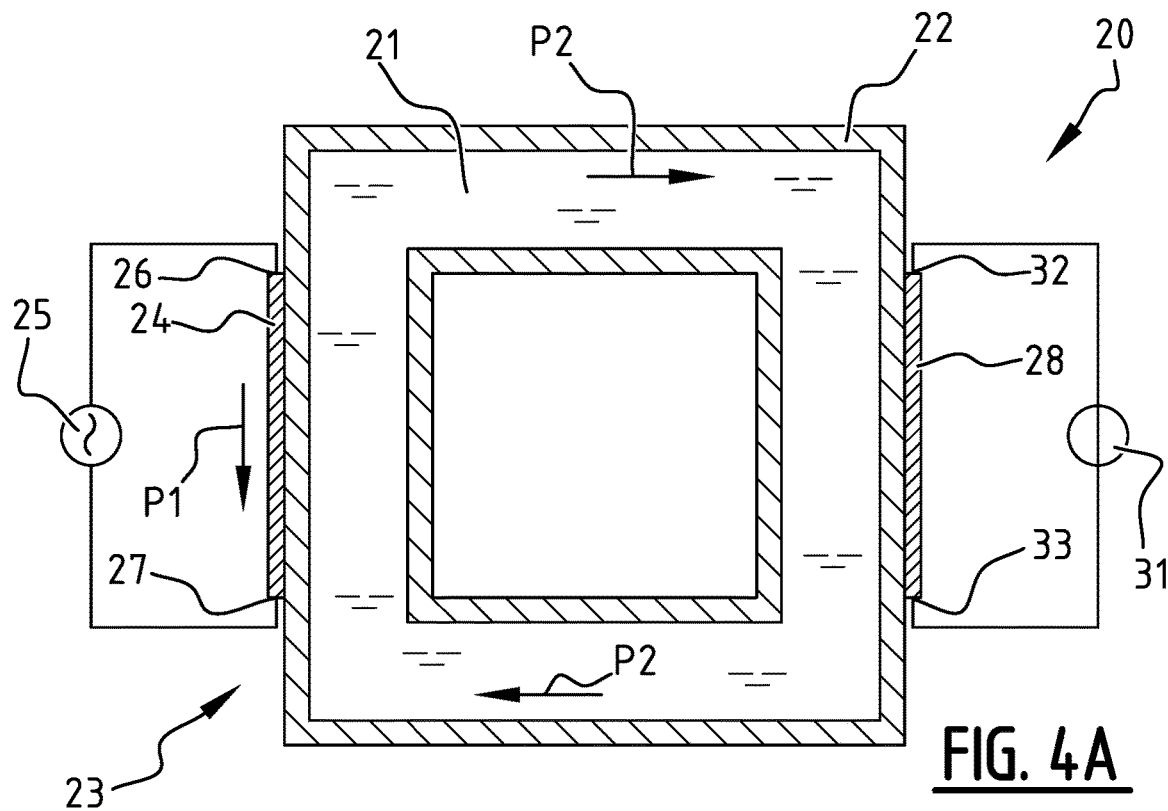
FIG. 4A, FIG. 4B, FIG. 4C, FIG. 4D, and FIG. 4E are cross-sections of further embodiments of the conductivity measuring system.
Figure 4B:
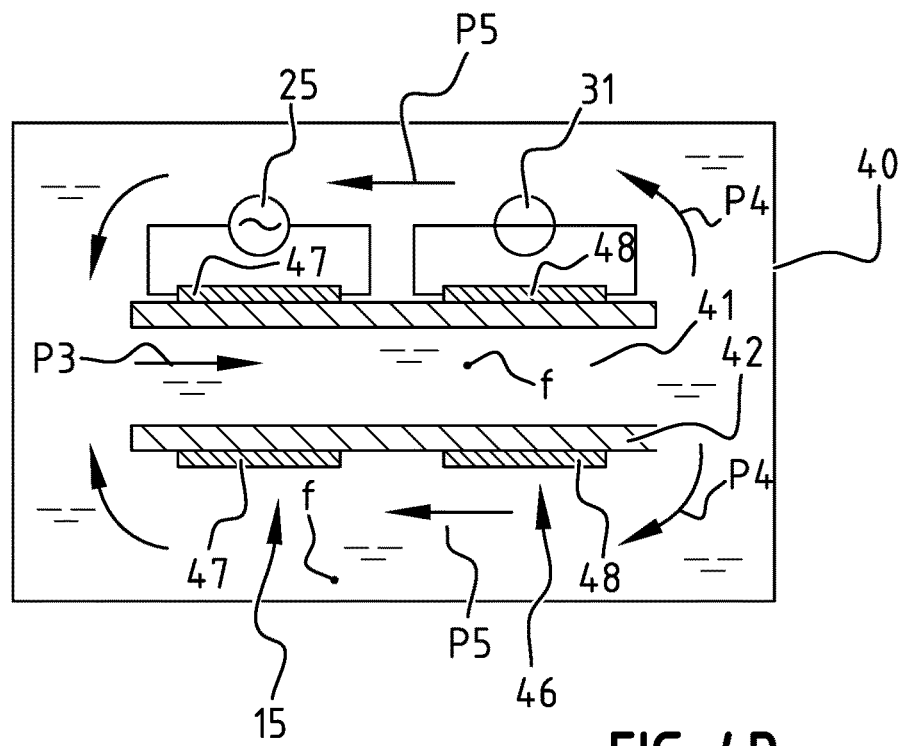

FIG. 4A presents an overview of a cross-section of a further embodiment of the conductivity measuring system, including both the excitation side (in the figure, the left hand side) and the sensing side (in the figure the right hand side) of the system. The fluid channel 21 here is formed by a holder 22 that has a substantially annular shape. This ensures that any induced electrical current can run in a loop. However, the holder may take any other suitable shape allowing the liquid conduit(s) defined therein to form a closed loop enabling a current to run inside the liquid from one conducting slab to the other.

The excitation device in this embodiment comprises a conduction slab 24 in the shape of a conductive strip attached to one side of the (isolating) wall of the holder 22 and an electrical signal generator 25, for instance a voltage or current source. The conductive slab 24 is arranged at a first elongated part 23 of the fluid channel 21 (defining a longitudinal direction). The conductive slab may be embodied as a conductive strip (as shown), a conductive tube arranged around the holder 2, may be a single slab (strip, tube, etc.) or may comprise a plurality of slabs or slab parts (for instance, a number of concentric tubular slabs/slab parts), for instance as discussed in in any of FIGS. 3A-3D.

Referring to the embodiment of FIG. 4A, the elongated conducting slab 24 can be oriented in an arbitrary direction relative to the longitudinal direction of the elongated oart 23 of the fluid channel. In the shown embodiment the elongated part 23 extends parallel to the longitudinal direction of the elongated part 23. The conducting slab 24 may be connected via a first connection element 26 and a second connection element 27 to a current source 25. The current source 25 is configured to generates an alternating current, for instance in a first direction $P_1$, inside the conducting slab 24. The connection elements 26 and 27 are positioned at different longitudinal positions so as to generate an electrical flow in longitudinal direction along the fluid channel wall part 23. The current in the conducting slab gives rise to a current in opposite direction, i.e. direction $P_2$ opposite direction $P_1$, inside the fluid channel 21.

Similarly, at a second elongated part 20 of the fluid channel 21 (also defining a longitudinal direction) a second conducting slab 28 as part of the sensing device is arranged, for instance a conducting slab similar or identical to the conducting slab as discussed in any of FIGS. 3A-3D. The second conducting slab 28 is connected via a first connection element 32 and a second connection element 33 to an electric measuring instrument 31, for instance a voltage sensor. The connection elements 32 and 33 are positioned at different longitudinal positions. The current in the fluid channel may give rise to a voltage over the second conducting slab 28 which voltage may be detected by the voltage sensor 31.

Given for example that the electric signal generator 25 dictates that the current running through the exiting (first) conducting slab 24 runs from top to bottom in direction $P_1$ (see FIG. 4A), the temporal variation of this current excites an E-field in the fluid channel 21 oriented against the original current. The ionic solute reacts to the E-field by an induced electrical current in same direction or from downwards up when compared to the fluid channel running adjacent to the exciting (first) conducting slab 24 or clockwise when compared to the whole of the fluid channel.

On the right-hand side, the temporal changes in the induced electrical current induces an E-field on the sensing (second) conducting slab 28 in the opposite direction. The extension of the field over the length of the conductor results in a voltage that can be detected by the voltage sensor 31.

The composition of the two conducting slabs 24,28 is known to effect the received signal strength. It can be envisaged that the conducting slabs are explicitly placed with their axis aligned, possibly in the extension of one another or partly or completely overlapping. Conducting slabs can be placed arbitrarily unaligned when compared to each others axis of which a specific scenario of interest is the conducting slabs being placed orthogonally to each other to reduce distortion due to magnetic coupling. Alternatively or additionally, the conducting slabs 24 and 28 may be placed sufficiently remote from each other to reduce distortion.

FIG. 4B shows another embodiment of the present disclosure. The conductivity measurement system comprises a holder including 1 container 40 filled with fluid (f) in which the excitation device 45 and sensing device 46 have been completely immersed. The excitation device 45 and sensing device 46 have been arranged on the wall of a tubular holder part 42 which forms a fluid channel 41 inside the container 40. Hence the holder 42 forms a passageway immersed in the fluid (f). This ensures that any induced electrical current can run in a loop, i.e. through the bulk of the fluid as is schematically shown by the arrows $P_3,P_4,P_5$.

The excitation device 45 comprises a tubular conductive slab 47 while the sensing device 46 comprises a tubular conductive slab 48, both slabs 47,48 being arranged around the tubular holding part 42 and connected respectively to an electrical signal generator 25 and a sensing device 31. This is an example of the shape that the conductivity measuring system can take if a large container of the fluid is accessible and the conductivity measuring device is introduced later.

Figure 4C:
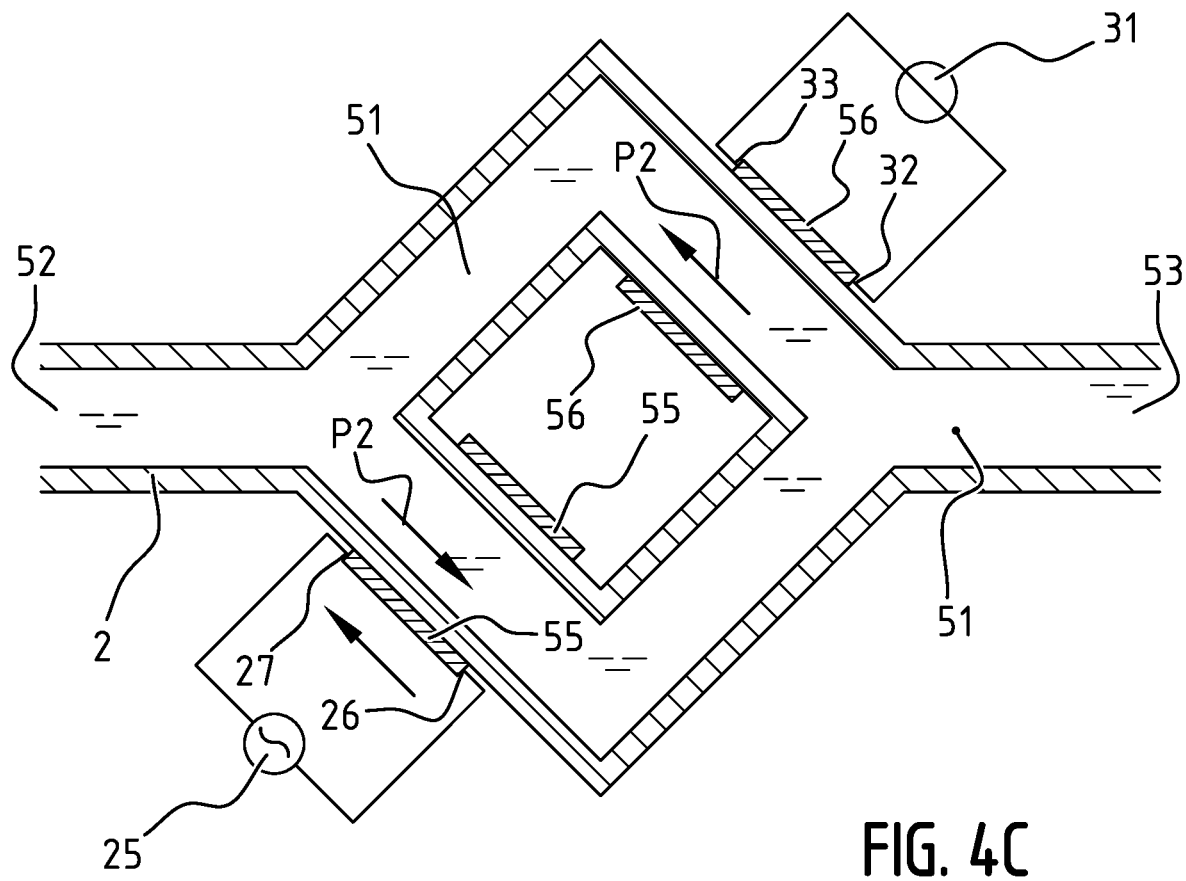

FIG. 4C presents an overview of a cross-section of a further embodiment of the conductivity measuring system. Whereas the fluid channel 21 of FIG. 4A was a closed channel, the fluid channel 51 according to the present embodiment is an open channel. The fluid channel 51 comprises a supply opening 51 for supplying fluid and a discharge opening 53 for discharge of fluid. Similar to the configuration of FIG. 4A, the fluid passage 51 forms a ring-shaped conduit so that any induced electrical current in the fluid (f) can run in a loop. In this embodiment the fluid can continuously flow from the supply opening 52 to the discharge opening 52 during which flow the measurement of the composition by the conductivity measuring system may be performed. The set-up makes it possible to measure the conductivity in real time during the flow of the fluid through a conduit.

Although the conductive slabs 24,28 of the embodiment of FIG. 4A are shown as elongated conductive strips provided on respective sides of the holder wall and the conductive slabs 55 and 56 of the embodiment of FIG. 4C are shown as tubular conductive slabs provided at least partially around the holder wall, it is clear to the skilled person that different configurations of the holder and conductive elements can be applied as well.

Figure 4D:
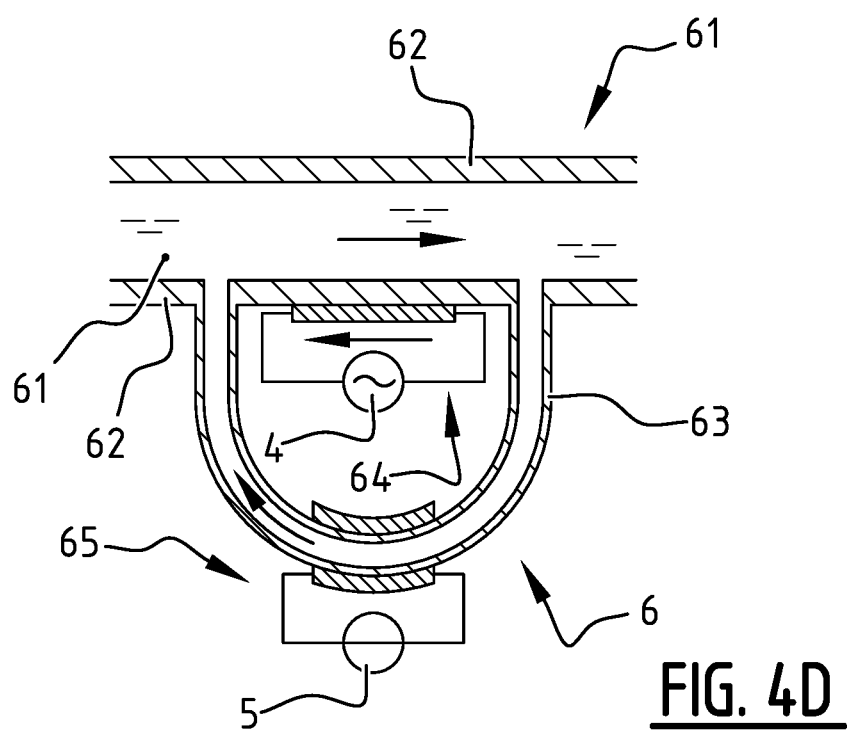

FIG. 4D shows a still further embodiment of a conductivity measuring system 60 wherein the holder 61 is an existing fluid tube 62 in which a fluid channel 68 is formed and a retrofitted bypass fluid tube 63. The excitation device 64 and the sensing device 65 are attached to the existing fluid tube 62 and retrofitted bypass fluid tube 63, respectively.

Figure 4E:
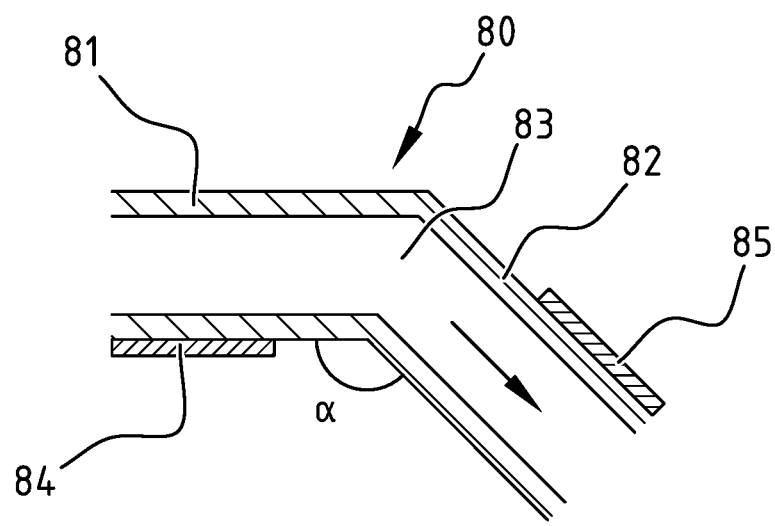

FIG. 4E shows another embodiment of the present disclosure. In this embodiment the holder 80 comprises a first holder part 81 provided with an excitation device 84 (only partly shown in FIG. 4E) and a second holder part 82, connected to the first holder part 81, provided with a sensing device 85 (only partly shown in FIG. 4E). In order to reduce interference between the excitation device 84 and sensing device 85 the (longitudinal direction of the) second holder part 82 extends obliquely with respect to the (longitudinal direction of the) first holder part 81. If the angle ($\alpha$) is in the range of about 30-120 degrees, for instance between 80 and 100 degrees, or, preferably, if the angle is about 90 degrees, the interference will be reduced to increase the accuracy of the conductivity measurement.

Figure 5:
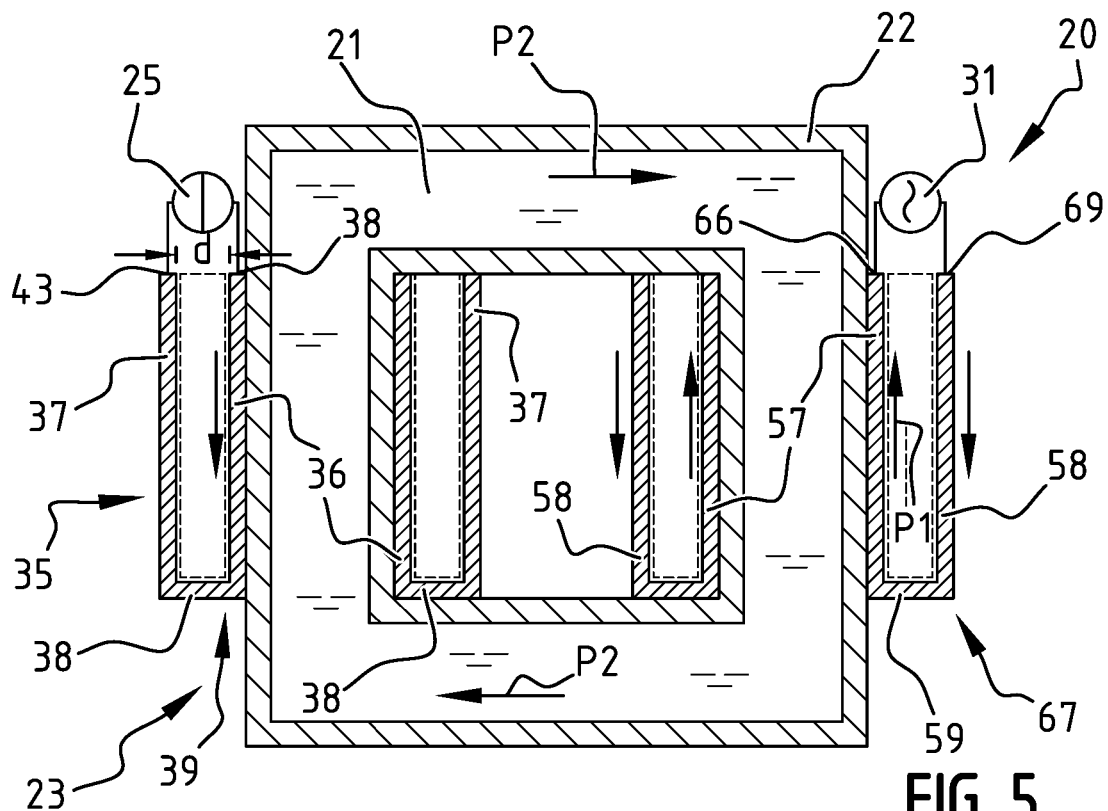
FIGS. 5 and 6 cross-sections of further embodiments of a conductivity measuring system.

FIG. 5 shows another embodiment of the present disclosure. The arrangement of the holder corresponds to the arrangement described in connection with FIG. 4A. Also the positioning the conductive slabs of the excitation device and sensing device are the same. A detailed description of some of the elements of the embodiment of FIG. 4A are therefore left out here.

The excitation device of FIG. 5 comprises a conductive slab 35 comprised of two concentric tubular conducting slab parts 36,37 arranged at the earlier-mentioned first elongated part 23 of the fluid channel 21. More specifically, the excitation device comprises a tubular inner conducting slab part 36 arranged around the holder 22 (for instance concentrically with respect to the fluid channel 21 therein) to directly face the fluid channel 21 inside the holder 22 and a tubular outer conducting slab part 37 arranged concentrically around the tubular inner conducting slab part 36. The outer conducting slab part 37 extends generally parallel to the inner conducting slab part 36, at a distance (d) away from the tubular inner conducting slab 36. Both tubular conductive slab parts 36,37 are interconnected at one of their ends with a conductive connection part 38. The inner conducting slab part 36 is close to its free end provided with a first connection element 38. The second connection element 39 is formed in this embodiment by the combination of the contact point 43, the outer conducting slab part 37 and the conductive connection part 38. Optionally, a passive material (as shown in dotted lines) may be arranged in the interspace between the inner and outer conductive slab parts 36,37.

Similarly, the sensing device of FIG. 5 comprises a conductive slab comprised of two concentric tubular conducting slab parts 57,58 arranged at the earlier-mentioned second elongated part 20 of the fluid channel 21. More specifically, the sensing device comprises a tubular inner conducting slab part 57 arranged around the holder 22 (for instance concentrically with respect to the fluid channel 21 therein) to directly face the fluid channel 21 inside the holder 22 and a tubular outer conducting slab part 58 arranged concentrically around the tubular inner conducting slab part 57. The outer conducting slab part 58 extends generally parallel to the inner conducting slab part 57, at a distance away from the tubular inner conducting slab 57. Both tubular conductive slab parts 57,58 are interconnected at one of their ends with a conductive connection part 59. The inner conducting slab part 57 is close to its free end provided with a contact point forming the first connection element 66. The second connection element 67 of the inner slab part 57 is formed in this embodiment by the combination of the contact point 69, the outer conducting slab part 58 and the conductive connection part 59. Optionally, a passive material (as shown in dotted lines) may be arranged in the interspace between the inner and outer conductive slab parts 57,58.

Figure 6:
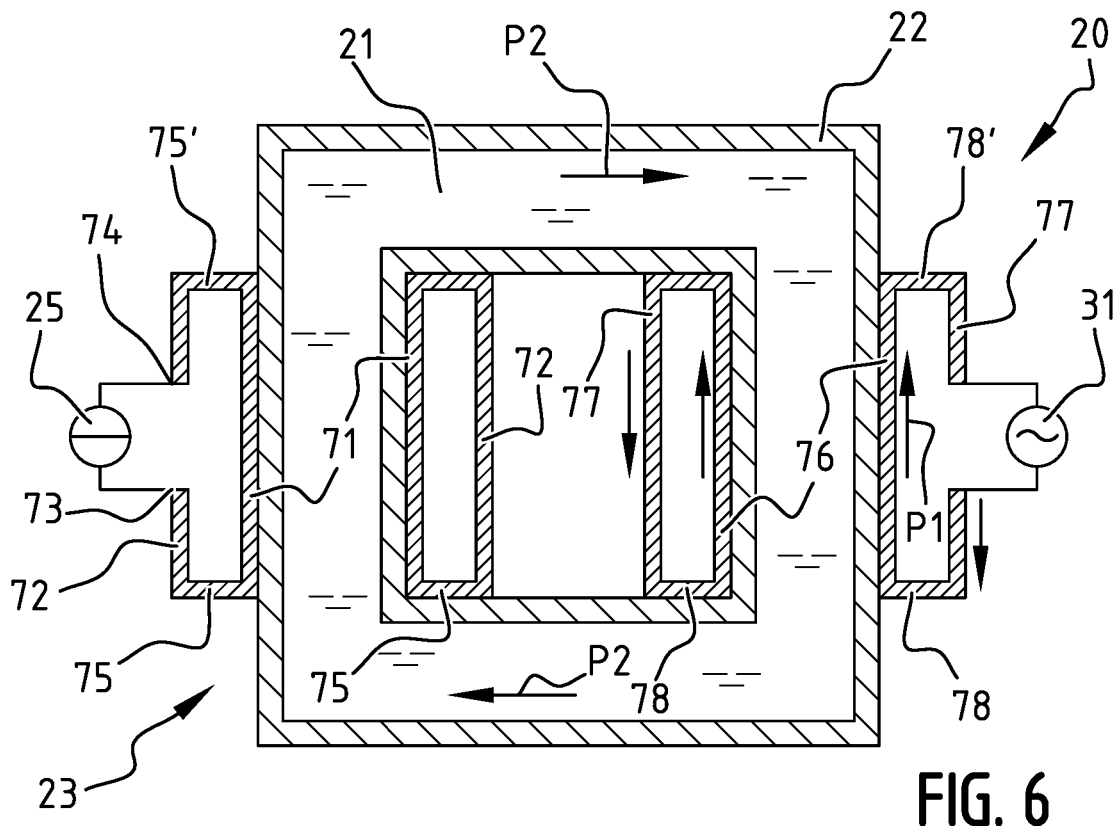

FIG. 6 shows a further embodiment of the conductivity measuring system according to the present disclosure. This embodiments corresponds to the embodiment of FIG. 5. However, in the embodiment of figure conducting slabs of the excitation device and the sensing device have a central connection rather than a connection at the fre ends thereof. The excitation device of FIG. 6 comprises a conductive slab comprised of two concentric tubular conducting slab parts 71,72 arranged at the earlier-mentioned first elongated part 23 of the fluid channel 21. More specifically, the excitation device comprises a tubular inner conducting slab part 71 arranged around the holder 22 to directly face the fluid channel 21 inside the holder 22 and a tubular outer conducting slab part 72 arranged concentrically around the tubular inner conducting slab part 71. The outer conducting slab part 72 extends generally parallel to the inner conducting slab part 71. The tubular conductive slab parts 71,72 are interconnected both at a first end with a connection part 75 and at an opposite, second end with a connection part 75'. The connection with the electrical signal generator 25 is accomplished via a first contact point 73 and a second contact point 74 arranged at the respective free ends of the outer conducting slab part 72. Also in this embodiment the contact points 73,74 are arranged at positions around the longitudinal center of the conductive slab. A first connection element with the inner conductive slab part 71 is therefore formed by the lower contact point 73, the outer conductive slab part 72 and the connection part 75, while a second connection element with the inner conductive slab part 71 is therefore formed by the upper contact point 74, the outer conductive slab part 72 and the connection part 75' so as to provide two longitudinally displaced connection positions of the electrical signal generator 25 to the inner conductive slab part 71.

Similarly, the sensing device comprises of FIG. 6 comprises a conductive slab comprised of two concentric tubular conducting slab parts 76 and 77 arranged at the earlier-mentioned second elongated part 20 of the fluid channel 21. More specifically, the sensing device comprises a tubular inner conducting slab part 76 arranged around the holder 22 to directly face the fluid channel 21 inside the holder 22 and a tubular outer conducting slab part 77 arranged concentrically around the tubular inner conducting slab part 76. Both tubular conductive slab parts 76,77 are interconnected at either end respective conductive connection parts 78,78'.

Figure 7:
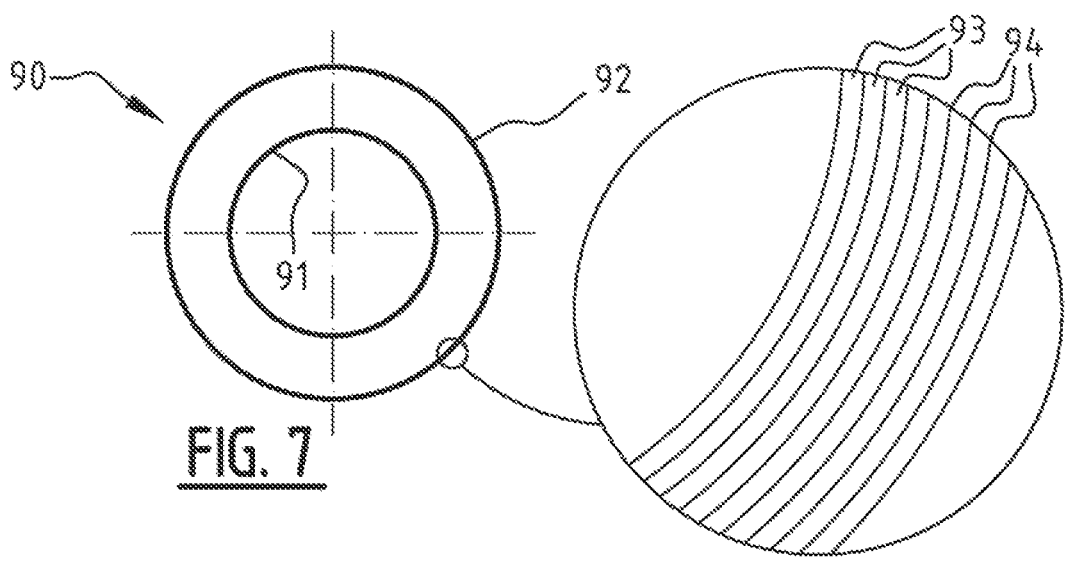
FIG. 7 a section perpendicular to the longitudinal direction of an embodiment of a conductive slab having two concentric tubular conductive slab parts, including a magnified detail view.

FIG. 7 shows a typical cross-section of an embodiment (herein also referred to as a Litze tube) of an excitation device and/or sensing device including two concentric tubular conducting slabs. The device 90 comprises an inner tubular conducting slab part 91 and an outer conducting slab part 92. Each of the slabs in this embodiment comprises a tubular roll of conductive material. More specifically, each of the slabs or slab parts comprises a plurality (in the shown embodiment 10, but this number may also be smaller or larger) of windings of a thin sheet 94 of conductive material and in between the windings an electrically isolating material 93 is provided. As an alternative to one sheet of material arranged in a plurality of windings is to embody the outer and/or inner conductive slab as a number of concentric sheets of conductive material.

Figure 8:
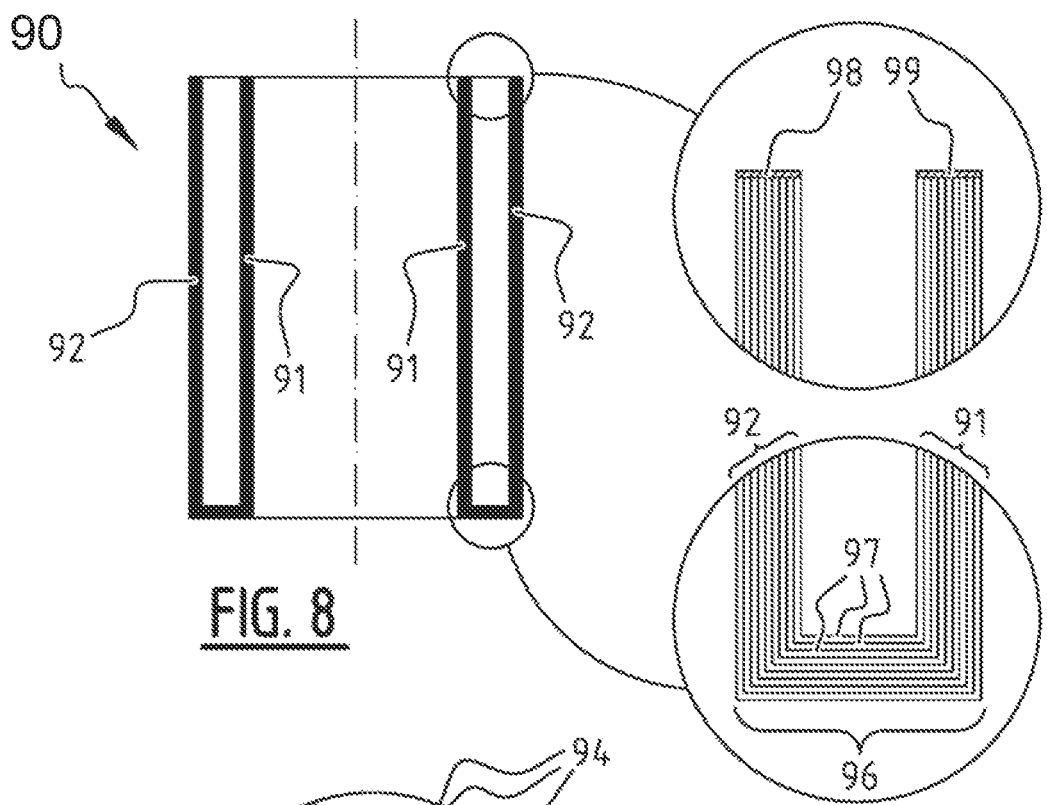
FIG. 8 a longitudinal section of the an embodiment of a conductive slab having two concentric tubular conductive slab parts, including magnified detail views of the connection part at a first end and a connection element at a second end of the slab parts.

In FIG. 8 (cf. the embodiments of FIGS. 5 and 6) is shown how the conductive sheets 94 may be interconnected at at least one outer end of the device 90, i.e. by individually interconnecting the individual sheets 94 of electrically conductive material with respective connecting sheets 97 of electrically conductive material forming the connection part 96. At the opposite, free end of the device 90 conductive sheets 94 of the inner conductive slab 92 are interconnected by the first connection element 99 and the conductive sleeves 94 of the outer conductive slab 92 are interconnected by the second connection element 98.

Figure 9:
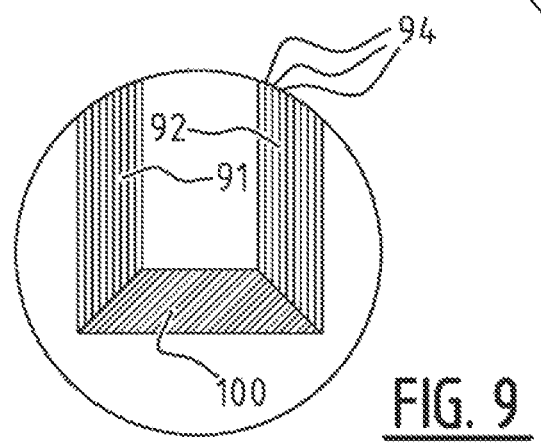
FIG. 9 a magnified detail views of an alternative connection part.

FIG. 9 show an alternative embodiment of the connection part 96. In this embodiment the connection part 100 is formed by attaching all free ends of the windings of the inner and outer conductive slab part to each other, for instance by soldering or a similar process, to provide an electrical connection between the windings.

In a further embodiment the conductivity measuring system comprises an analyser (not shown in the figures) configured to determine from the measured voltage signal as function of the frequency a composition signal representative of the composition of the fluid. The composition signal may contain an indication of at least one of the type and concentration of the constituents of the fluid.

The present disclosure also includes the following clauses:

1. Conductivity measuring system with the purpose of contactless detection of the frequency dependent conductivity of a fluid including a solvent and an ionic solute, the conductivity measuring system comprising:
    a holder comprising an isolated holder wall defining a fluid channel for holding fluid, wherein the holder is shaped to allow an electrical current induced in the fluid inside the fluid channel to form a current loop;
    an excitation device configured to excite an electric field inside a first part of the fluid channel, the excitation device comprising:
        an electrical signal generator configured to generate an alternating current signal with one ore more predefined frequencies;
        a conducting slab, placed on or in the direct vicinity of the isolated holder wall of the first part of the fluid channel, the conducting slab comprising connection elements connected to the electrical signal generator and arranged so as to induce a current in the fluid inside the first part of the fluid channel;
    a sensing device arranged at a position remote from the first part of the fluid channel and configured to sense a voltage signal (V) resulting from the current generated inside the fluid by the excitation device.

2. Conductivity measuring system as defined in clause 1, wherein the conducting slab has an elongated shape extending in the longitudinal direction of the first part of the fluid channel.

3. Conductivity measuring system as defined in clause 2, wherein the elongated conducting slab is formed by a conductive strip arranged along the isolated holder wall defining the first part of the fluid channel.

4. Conductivity measuring system as defined in any of the preceding clauses, wherein the isolated holder wall of the first part of the fluid channel has a generally tubular shape and/or wherein the conducting slab has a generally tubular shape partly or fully surrounding the isolated holder wall.

5. Conductivity measuring system as defined in any of the preceding clauses, wherein the conducting slab has a first longitudinal end and a second longitudinal end, wherein a first connection element is arranged at the first longitudinal end and a second connection element is arranged at the second longitudinal end of the conducting slab.

6. Conductivity measuring system as defined in any of the preceding clauses, wherein the sensing device comprises a sensing element placed on or in the vicinity of the isolated holder wall of a second part of the fluid channel, remote from the first part of the fluid channel.

7. Conductivity measuring system as defined in clause 6, wherein the sensing device comprises:
    a second conducting slab, placed on or in the direct vicinity of the isolated holder wall of the second part of the fluid channel;
    a voltage sensor connected to the second conducting slab and configured to sense the voltage generated in the second conducting slab as a result of the current in the fluid in the second part of the fluid channel.

8. Conductivity measuring system as defined in clause 6, wherein the sensing device comprises a sense coil arranged around the isolated holder wall of the second part of the channel and a voltage sensor connected to the sense coil and configured to sense the voltage generated in the sense coil as a result of the current in the fluid in the second part of the fluid channel.

9. Conductivity measuring system as defined in any of the preceding clauses, wherein the longitudinal direction of the first part of the fluid channel extends at an angle ($\alpha$) relative to the longitudinal direction of the second part of the fluid channel, wherein the angle preferably is in the range of about 30-120 degrees, for instance between 80 and 100 degrees.

10. Conductivity measuring system as defined in any of the preceding clauses, wherein the holder comprises an existing fluid tube and a retrofitted bypass fluid channel, wherein preferably at least one of the excitation device and the sensing device is attached to the existing fluid tube.

11. Conductivity measuring system as defined in any of the preceding clauses, wherein the electrical signal generator

17 is configured to generate an alternating current signal of varying frequency and wherein the sensing device is configured to sense the resulting varying voltage signal.

12. Conductivity measuring system as defined in clause 11, wherein the electrical signal generator is configured to generate a current signal in the range of 100 kHz up to 100 MHz.

13. Conductivity measuring system as defined in clause 11 or 12, further comprising an analyser configured to determine from the measured voltage signal as function of the frequency a composition signal representative of the composition of the fluid.

14. Conductivity measuring system as defined in any of the preceding clauses, wherein at least the conduction slab of the exciting device and/or the sensing device, preferably also at least one of the holder, electrical signal generator and sensing device, are fabricated in a microchip environment.

15. Conductivity measuring system as defined in any of the preceding clauses, wherein the isolated holder walls of the holder form a loop-shaped channel.

16. Conductivity measuring system as defined in any of the preceding clauses, wherein the isolated holder walls of the holder form a closed channel.

17. Conductivity measuring system as defined in any of the preceding clauses, wherein the isolated holder walls of the holder form an open channel comprising a supply opening for supplying fluid and a discharge opening for discharge of fluid, wherein the fluid channel extends between the supply opening and discharge opening.

18. Conductivity measuring system as defined in any of the preceding clauses, wherein the holder comprises a container and a tubular holder wall arranged in the interior of the container, the tubular holder wall forming the fluid channel.

19. Conductivity measuring system as defined in clause 18, wherein the excitation device, optionally also the sensing device, are arranged in the interior of the container.

20. Conductivity measuring system as defined in any of the preceding clauses, wherein a conducting slab of the exciting device, preferably also the conducting slab of the sensing device, comprises a first conducting slab part arranged to face the fluid channel, a second conducting slab part arranged away from the first conducting slab part and a connection element electrically connecting the first and second conducting slab parts, the first and second connection elements being positioned at the free ends of the first and second conducting slab parts, respectively.

21. Use of the conductivity measuring system as defined in any of the preceding clauses.

22. Method of contactless detecting frequency dependent conductivity of a fluid including a solvent and an ionic solute, preferably using a conductivity measuring system as defined in any of the preceding clauses, wherein the method comprises:
arranging the fluid in a holder comprising an isolated holder wall defining a fluid channel for holding the fluid, wherein the holder is shaped to allow an electrical current induced in the fluid inside the fluid channel to form a current loop;
exciting an electric field inside a first part of the fluid channel, wherein exciting the electric field comprises generating an alternating current signal with one or more predefined frequencies and supplying the alternating current signal to connection elements of a conducting slab, the conducting slab having been placed on or in the direct vicinity of the isolated holder wall of the first part of the fluid channel, so as to induce a current in the fluid inside the first part of the fluid channel;

18 sensing a voltage signal (V) as a result of a changing magnetic field resulting from the current that has been generated inside the fluid.

23. Method as defined in clause 22, comprising:
generating an alternating current signal of varying frequency; and
sensing the varying voltage signal resulting from the generation of the alternating current so as to determine the voltage signal as function of the frequency.

24. Method as defined in clause 23, comprising generating the current signal with frequencies in the range of 100 kHz up to 100 MHz.

25. Method as defined in clauses 23 or 24, comprising determining from the measured voltage signal as function of the frequency a composition signal representative of the composition of the fluid.

The present invention is not limited to the embodiments thereof stated herein. The rights sought are defined by the following clauses, within the scope of which numerous modifications can be envisaged.

The invention claimed is:

1. A conductivity measuring system with a purpose of contactless detection of a frequency dependent conductivity of a fluid including a solvent and an ionic solute, the conductivity measuring system comprising:
a holder including a holder wall comprised of electrically insulating material, the holder defining a fluid channel for holding fluid, wherein at least a portion of the fluid channel is loop-shaped;
an excitation device arranged outside of the holder and configured to excite an electric field inside a first part of the fluid channel, the excitation device comprising:
an electrical signal generator configured to generate an alternating current signal with one or more predefined frequencies, and
a conducting slab, placed on or in a direct vicinity of the holder wall of the first part of the fluid channel, the conducting slab comprising connection elements arranged at different longitudinal positions along the fluid channel and connected to the electrical signal generator, wherein the electrical signal generator and the conducting slab are configured to induce between the connections elements a current through the conducting slab inducing an electrical current in the fluid inside the first part of the fluid channel, and wherein the electrical current induced in the fluid forms a current loop inside the fluid channel; and
a sensing device arranged outside of the holder at a position remote from the first part of the fluid channel and configured to sense a voltage signal resulting from the electrical current induced inside the fluid by the excitation device.

2. The conductivity measuring system of claim 1,
wherein the sensing device comprises a sensing element,
wherein the sensing device comprises a second conducting slab, placed on or in the direct vicinity of the holder wall of a second part of the fluid channel, remote from the first part of the fluid channel, and comprising connection elements arranged at different longitudinal positions along the fluid channel and connected to a voltage sensor, and
wherein the voltage sensor is connected to the connection elements of the second conducting slab and is configured to sense a voltage generated in the second conducting slab as a result of the current through the second conducting slab between the connection elements resulting from the electrical current induced inside the fluid in the second part of the fluid channel.

3. The conductivity measuring system of claim 1, wherein the sensing device comprises:
a sense coil placed on or in the direct vicinity of the holder wall of a second part of the fluid channel, remote from the first part of the fluid channel, and arranged around the holder wall; and
a voltage sensor connected to the sense coil and configured to sense a voltage generated in the sense coil as a result of the electrical current in the fluid in the second part of the fluid channel.

4. The conductivity measuring system of claim 1, wherein the conducting slab has an elongated shape extending in a longitudinal direction of the first part of the fluid channel.

5. The conductivity measuring system of claim 1, wherein the holder wall of the first part of the fluid channel has a tubular shape and/or wherein the conducting slab has a tubular shape partly or fully surrounding the holder wall.

6. The conductivity measuring system of claim 1,
wherein the conducting slab has a first longitudinal end and a second longitudinal end, and
wherein a first connection element is arranged at the first longitudinal end and a second connection element is arranged at the second longitudinal end of the conducting slab.

7. The conductivity measuring system of claim 1, wherein a longitudinal direction of the first part of the fluid channel extends at an angle relative to a longitudinal direction of a second part of the fluid channel.

8. The conductivity measuring system of claim 1, wherein the electrical signal generator is configured to generate an alternating current signal of varying frequency, and wherein the sensing device is configured to sense a resulting varying voltage signal.

9. The conductivity measuring system of claim 1, wherein holder walls of the holder form a loop-shaped channel; and/or wherein the holder walls of the holder form a closed channel or wherein the holder walls of the holder form an open channel comprising a supply opening for supplying fluid and a discharge opening for discharge of fluid, wherein the fluid channel extends between the supply opening and discharge opening.

10. The conductivity measuring system of claim 1, wherein the holder comprises a container and a tubular holder wall arranged in an interior of the container, the tubular holder wall forming at least a portion of the fluid channel.

11. A conductivity measuring system with a purpose of contactless detection of a frequency dependent conductivity of a fluid including a solvent and an ionic solute, the conductivity measuring system comprising:
a holder including a holder wall comprised of electrically insulating material, the holder defining a fluid channel for holding fluid, wherein at least a portion of the fluid channel is loop-shaped;
an excitation device arranged outside of the holder and configured to excite an electric field inside a first part of the fluid channel, the excitation device comprising:
an electrical signal generator configured to generate an alternating current signal with one or more pre-defined frequencies, and
a conducting slab, placed on or in a direct vicinity of the holder wall of the first part of the fluid channel, the conducting slab comprising connection elements arranged at different longitudinal positions along the fluid channel and connected to the electrical signal generator, wherein the electrical signal generator and the conducting slab are configured to induce between the connections elements a current through the conducting slab inducing an electrical current in the fluid inside the first part of the fluid channel, and wherein the electrical current induced in the fluid forms a current loop inside the fluid channel; and
a sensing device arranged outside of the holder at a position remote from the first part of the fluid channel and configured to sense a voltage signal resulting from the electrical current induced inside the fluid by the excitation device,
wherein one or more from among a conducting slab of the exciting device or a conducting slab of the sensing device comprises:
a first conducting slab part arranged to face the fluid channel, and
a second conducting slab part arranged away from the first conducting slab part and a connection element electrically connecting the first conducting slab part and the second conducting slab part, and
wherein a first connection element and a second connection element are positioned at free ends of the first conducting slab part and the second conducting slab part, respectively.

12. The conductivity measuring system of claim 1,
wherein the conducting slab or a conducting slab part comprises a tubular roll formed of a plurality of windings of a thin sheet of electrically conductive material, and
wherein an electrically isolating material is arranged in between the plurality of windings.

13. A conductivity measuring system with a purpose of contactless detection of a frequency dependent conductivity of a fluid including a solvent and an ionic solute, the conductivity measuring system comprising:
a holder including a holder wall comprised of electrically insulating material, the holder defining a fluid channel for holding fluid, wherein at least a portion of the fluid channel is loop-shaped;
an excitation device arranged outside of the holder and configured to excite an electric field inside a first part of the fluid channel, the excitation device comprising:
an electrical signal generator configured to generate an alternating current signal with one or more pre-defined frequencies, and
a conducting slab, placed on or in a direct vicinity of the holder wall of the first part of the fluid channel, the conducting slab comprising connection elements arranged at different longitudinal positions along the fluid channel and connected to the electrical signal generator, wherein the electrical signal generator and the conducting slab are configured to induce between the connections elements a current through the conducting slab inducing an electrical current in the fluid inside the first part of the fluid channel, and wherein the electrical current induced in the fluid forms a current loop inside the fluid channel; and
a sensing device arranged outside of the holder at a position remote from the first part of the fluid channel and configured to sense a voltage signal resulting from the electrical current induced inside the fluid by the excitation device,
wherein a wall of the conducting slab or a wall of a conducting slab part of the conducting slab comprises a plurality of concentric tubular sheets of electrically conductive material, and wherein an electrically isolating material is arranged between the sheets of electrically conductive material.

14. A use of the conductivity measuring system as claimed in claim 1, the use comprising detecting, contactlessly, a frequency dependent conductivity of a fluid including a solvent and an ionic solute.

15. A method of contactless detecting frequency dependent conductivity of a fluid including a solvent and an ionic solute using the conductivity measuring system of claim 1, wherein the method comprises:
arranging the fluid in a holder comprising an isolated holder wall defining a fluid channel for holding the fluid, wherein the holder is shaped to allow an electrical current induced in the fluid to form a current loop inside the fluid channel;
exciting an electric field inside a first part of the fluid channel, wherein exciting the electric field comprises generating an alternating current signal with one or more predefined frequencies and supplying the alternating current signal to connection elements of a conducting slab, the conducting slab having been placed on or in the direct vicinity of the isolated holder wall of the first part of the fluid channel, so as to induce between the connections elements a current through the conducting slab inducing an electrical current in the fluid inside the first part of the fluid channel, wherein the electrical current induced in the fluid forms the current loop inside the fluid channel; and
sensing a voltage signal as a result of a changing magnetic field resulting from the electrical current that has been generated inside the fluid.

16. The method of claim 15, further comprising:
generating an alternating current signal of varying frequency; and
sensing a varying voltage signal resulting from generating the alternating current signal of varying frequency so as to determine the voltage signal as function of the frequency;
and/or comprising generating the current signal with frequencies in a range of 100 kHz up to 100 MHz;
and/or comprising determining from the voltage signal as function of the frequency a composition signal representative of a composition of the fluid.

17. The conductivity measuring system of claim 10, wherein the excitation device and/or the sensing device are arranged in the interior of the container.

18. The conductivity measuring system of claim 4, wherein the elongated conducting slab is formed by a conductive strip arranged along the holder wall defining the first part of the fluid channel.

19. The conductivity measuring system of claim 7, wherein the angle is in one or more of the following ranges: 30 to 120 degrees or 80 to 100 degrees.

20. The conductivity measuring system of claim 8, wherein:
the electrical signal generator is configured to generate a current signal in a range of 100 kHz up to 100 MHz, and/or
the electrical signal generator further comprises an analyzer configured to determine from the voltage signal as function of the frequency a composition signal representative of a composition of the fluid.

* * * * *